(12) United States Patent
Harvey

(10) Patent No.: US 6,583,421 B2
(45) Date of Patent: Jun. 24, 2003

(54) CHARGE MEASURING DEVICE WITH WIDE DYNAMIC RANGE

(75) Inventor: Philip C. Harvey, Hampton Falls, NH (US)

(73) Assignee: Diamond Semiconductor Group, LLC, Gloucester, MA (US)

(*) Notice: Subject to any disclaimer, the term of this patent is extended or adjusted under 35 U.S.C. 154(b) by 76 days.

(21) Appl. No.: 09/975,685

(22) Filed: Oct. 11, 2001

(65) Prior Publication Data

US 2003/0071222 A1 Apr. 17, 2003

(51) Int. Cl.[7] .............................................. G01K 1/08
(52) U.S. Cl. ................................. 250/397; 250/492.2
(58) Field of Search ............................ 250/397, 492.1, 250/374

(56) References Cited

U.S. PATENT DOCUMENTS

| | | | |
|---|---|---|---|
| 3,921,012 A | 11/1975 | Marhsall, III | 307/271 |
| 4,011,449 A | 3/1977 | Ko et al. | 250/309 |
| 4,083,044 A | 4/1978 | Marshall, III et al. | 340/347 |
| 4,143,318 A | 3/1979 | Harvey | 324/111 |
| 4,277,747 A * | 7/1981 | Harvey | 324/76.62 |
| 4,517,465 A | 5/1985 | Gault et al. | 250/492.2 |
| 4,587,433 A | 5/1986 | Farley | 250/492.2 |
| 4,680,474 A | 7/1987 | Turner et al. | 250/492.2 |
| 4,721,857 A | 1/1988 | Kronenberg | 250/374 |
| 4,775,796 A | 10/1988 | Purser et al. | 250/492.2 |
| 4,818,884 A | 4/1989 | Saubolle | 250/388 |
| 4,831,271 A | 5/1989 | Dearnaley et al. | 250/492.2 |
| 4,849,641 A | 7/1989 | Berkowitz | 250/492.2 |
| 4,963,747 A | 10/1990 | Thacker | 250/388 |
| 5,198,676 A | 3/1993 | Benveniste et al. | 250/397 |
| 5,489,780 A | 2/1996 | Diamondis | 250/370.02 |
| 5,635,714 A | 6/1997 | Nablo et al. | 250/305 |
| 5,757,018 A | 5/1998 | Mack et al. | 250/492.21 |
| 5,760,409 A | 6/1998 | Chen et al. | 250/492.21 |

* cited by examiner

Primary Examiner—John R. Lee
Assistant Examiner—Christopher M Kalivoda
(74) Attorney, Agent, or Firm—Lahive & Cockfield, LLP

(57) ABSTRACT

A fast dosimeter for ion implantation and other systems that produce charges or current to be measured. When a charge accumulator reaches a predetermined charge, a fixed charge is removed to reduce the accumulated charge. A counter records each charge removal. Between removals, an analog-to-digital converter measures the accumulator charge. The outputs from the counter and the analog-to-digital converter provide a continually updated value for the total accumulated charge, and by differentiation, current with respect to time.

24 Claims, 5 Drawing Sheets

| COMPONENT | DESCRIPTION | | COMPONENT | DESCRIPTION |
|---|---|---|---|---|
| C1 | 22 nFd | | Q4 | MPS 6602 |
| C4 | 33 nFd | | Q5 | MPS 3904 |
| C5, C6 | 0.005 uFd | | Q6, Q7 | 2N 3904 |
| C18 | 0.01 uFd | | Q8 | J309 |
| C74 | 0.1 uFd | | Q10 | 2N4957 |
| C76 | 8.2 pFd | | Q11 | MPSW01A |
| | | | Q15 | 2N 3904 |
| R4–R8 | 17.4 kohm | | Q16 | 2N 3904 |
| R10 | 2 kohm | | Q17 | MPS 6652 |
| R11 | 22.1 kohm | | | |
| R15 | 100 ohm | | U1 | ICL7667 |
| R36 | 100 kohm, 0.025% | | U2 | 74HC132A |
| R37 | 100 megohm | | | |
| R43, R44 | 100 ohm | | A2, A3 | TLC082CD |
| R28 | 1000 ohm at 0° C | | A5 | LML6482AIN |
| | | | A7, A8 | LM385Z |

FIG. 4

CHARGE MEASURING DEVICE WITH WIDE DYNAMIC RANGE

BACKGROUND OF THE INVENTION

1. Field of the Invention

This invention generally relates to dosimeters and more particularly to dosimeters used for monitoring ion implantation processes.

2. Description of Related Art

Ion implantation devices, such as shown in U.S. Pat. No. 5,760,409 (1998) to Chen et al., require accurate measurements of ion beam characteristics such as ion beam current and charge. Atoms of an ion beam carry known charges, so such measurements provide important information for controlling the atomic dose implanted into a work piece, such as a semiconductor substrate. Faraday cages, or cups, are standard devices that trap and measure the ion beam charge, current or both. An electronic dose processor measures the Faraday charge or current to assess the implanted ion dose.

Ion beam currents from a Faraday cup and currents from other sensors can have a wide dynamic range. For example, U.S. Pat. No. 4,963,747 (1990) to Thacker discloses one type of ionizing radiation detector that integrates the input current from a detector in the sub picoampere to nanoampere range. This particular detector, that provides a qualitative indication of radiation above a particular threshold, can handle currents corresponding to radiation from 1000 to 0.01 R/hr. This is a dynamic range of 100,000:1.

U.S. Pat. No. 4,721,857 (1988) to Kronenberg discloses a sampling and recording dose rate meter that operates over a range 30 from 10,000 R/hr. In this instrument a sample and record circuit receives a selected input and transfers the result to a selected one of different storage capacitors for a precise interval of time. The plurality of storage capacitors covers the entire dynamic range. The selected storage capacitor accumulates and holds a voltage proportional to its charge for being read by an electrometer.

Circuits for monitoring low-level currents in other applications have also been provided. My U.S. Pat. No. 4,143,318 (1979) discloses a system that converts a signal from an ion gauge tube to a signal with a frequency proportional to the ratio of two current magnitudes, one of which is constant. Specifically, ion gauge tube current charges an integrating capacitor that is periodically discharged after the voltage across the capacitor reaches a pre-selected threshold. The variable frequency output signal is based upon the rate of discharges (the charge rate) and, since current is defined as rate of charge, is proportional to the current. Over any given interval, the integrated value of this variable frequency output signal, i.e., the pulse count, represents accumulated charge.

Similarly, U.S. Pat. No. 4,083,044 (1978) to Marshall et al. discloses a unipolar wide range current-to-frequency converter. This particular converter sums an input current and a feedback current. The input current represents the ion beam current from a Faraday cage or like device and a capacitive feedback amplifier produces a charge signal. When the charge signal reaches a predetermined level, a gated multivibrator enables a charge pulser to reduce the signal at the input by fully discharging the capacitive feedback amplifier. A data processor converts the number of charge pulser activations to a measurement of the accumulated charge.

Requirements for such measurement systems, especially those used in such ion implantation systems, are becoming more stringent. They require more frequent measurements than can accurately be made by accumulating slow pulses at low currents that are characteristic of prior art dosimeter systems. For example, it now is desirable to provide a measuring resolution of ±1% or ±3 pC, whichever is greater, of charge over a dynamic range of ion beam currents from below 100 nA to over 50 mA at measurement intervals from a few microseconds to several seconds.

Current-to-frequency converter measurements such as disclosed in the Marshall et al. and my patents have certain characteristics that can be disadvantageous in such applications. Each discharge removes an incremental charge. The resolution of the output signal is therefore dependent upon the magnitude of that incremental charge. Moreover, as the magnitude of the incremental charge decreases for better resolution, the discharge frequency at a given current will increase. With the wide dynamic ranges encountered in ion implantation systems, this frequency conversion approach has practical limits because circuits with such wide frequency ranges are difficult to manufacture and calibrate for use. If a current measurement rather than a charge measurement is desired, then, at very low currents, one has to wait for at least two pulses to make a frequency measurement. Further, in the Marshall et al. patent, each activation of the charge pulser fully discharges the charge accumulator capacitor. The final measurements then have an accumulated error corresponding to the sum of the charge represented by charging current that is simultaneous with each discharge.

SUMMARY

Therefore it is-an object of this invention to provide a dosimeter for an ion beam that accurately measures accumulated charge over time.

Another object of this invention is to provide a dosimeter for accurately measuring accumulated charge over time and over a single wide dynamic range without range switching.

Yet another object of this invention is to provide a dosimeter for ion beam current for accurately measuring accumulated charge over time and over a single wide dynamic range that is practical to manufacture.

Still another object of this invention is to provide a dosimeter for accurately measuring accumulated charge over time and over a single wide dynamic range that is simple to calibrate.

Still another object of this invention is to provide a dosimeter for accurately measuring accumulated charge over a wide dynamic range using a high sampling rate.

A dosimeter for measuring accumulated charge in accordance with this invention includes a charge accumulator having an input for receiving a signal and an output for producing a signal representative of accumulated charge. A charge measurement unit measures the magnitude of the accumulated charge at the charge accumulator output. A charge removal unit at the charge accumulator input removes a fixed charge from the charge accumulator when the magnitude of the accumulated charge reaches a predetermined threshold. Combining the number of operations of the incremental charge removing unit and the indicated charge magnitude from the charge measurement unit yields the accumulated charge.

In accordance with another aspect of this invention a dosimeter for measuring charge comprises a charge accumulator having an input and an output for producing a signal representative of accumulated charge at the input. The charge accumulator includes an operational amplifier with an input and output, a feed back capacitor for the operational amplifier that stores a charge and a summing junction at the operational amplifier input. When the magnitude of the accumulated charge at the charge accumulator output reaches a threshold, a charge removal circuit removes a fixed charge quantity from the charge accumulator. The charge removal circuit includes a switched capacitive storage circuit for storing a fixed charge and has charging and discharging modes of operation and a circuit for shifting the switched capacitive storage circuit between the charging and discharging modes of operation. The switched capacitive storage circuit switches to its discharge mode to discharge a fixed charge from the charge accumulator input when the signal at the charge accumulator output reaches the predetermined threshold value. The number of operations of the charge removal circuit and the indicated charge magnitude together correspond to the accumulated charge.

In accordance with still another aspect of this invention a dosimeter for measuring charge accumulated at a Faraday cup in an ion implantation device comprises a charge accumulator operational amplifier with an input, an output and a feed back capacitor for storing charge and a summing junction at the operational amplifier input for connection to the Faraday cup. A charge measuring analog-to-digital converter connects to the charge accumulator operational amplifier output for generating a digital output. A charge removal switched capacitive storage circuit for storing a fixed charge connects to the charge accumulator operational amplifier input and has charging and discharging modes of operation. A charge removal threshold circuit shifts the charge removal switched capacitive storage circuit between the charging and discharging modes of operation whereby the switched capacitive storage circuit discharges the fixed charge from the input of the charge accumulator operational amplifier when the signal at the charge accumulator operational amplifier output exceeds a predetermined threshold value. Combining the number of operations of the charge removal switched capacitive storage circuit with the output of the charge measuring analog-to-digital converter yields the accumulated charge.

In accordance with still another aspect of this invention a dosimeter for measuring the net charge comprises a charge accumulator, a charge measurer, first and second incremental charge modifiers and a counter circuit. The charge accumulator has an input connected to the charge gatherer and an output for producing a signal representative of accumulated charge. The charge measurer measures the magnitude of the accumulated charge at the charge accumulator output. A first charge modifier at the charge accumulator input removes a fixed charge from the charge accumulator during a single operation when the charge in said charge accumulator exceeds a first predetermined threshold. The second charge modifier at the charge accumulator input adds a fixed charge to the charge accumulator during a single operation when the charge in the charge accumulator falls below a second predetermined threshold. Two counter circuits provide a net count of the number of operations of said first and second charge modifier whereby the two counts and the indicated charge magnitude yield the net charge accumulated in said charge gatherer.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

FIG. 4 is a table that identifies component values used on one embodiment of this invention.

DESCRIPTION OF ILLUSTRATIVE EMBODIMENTS

Figure 1:
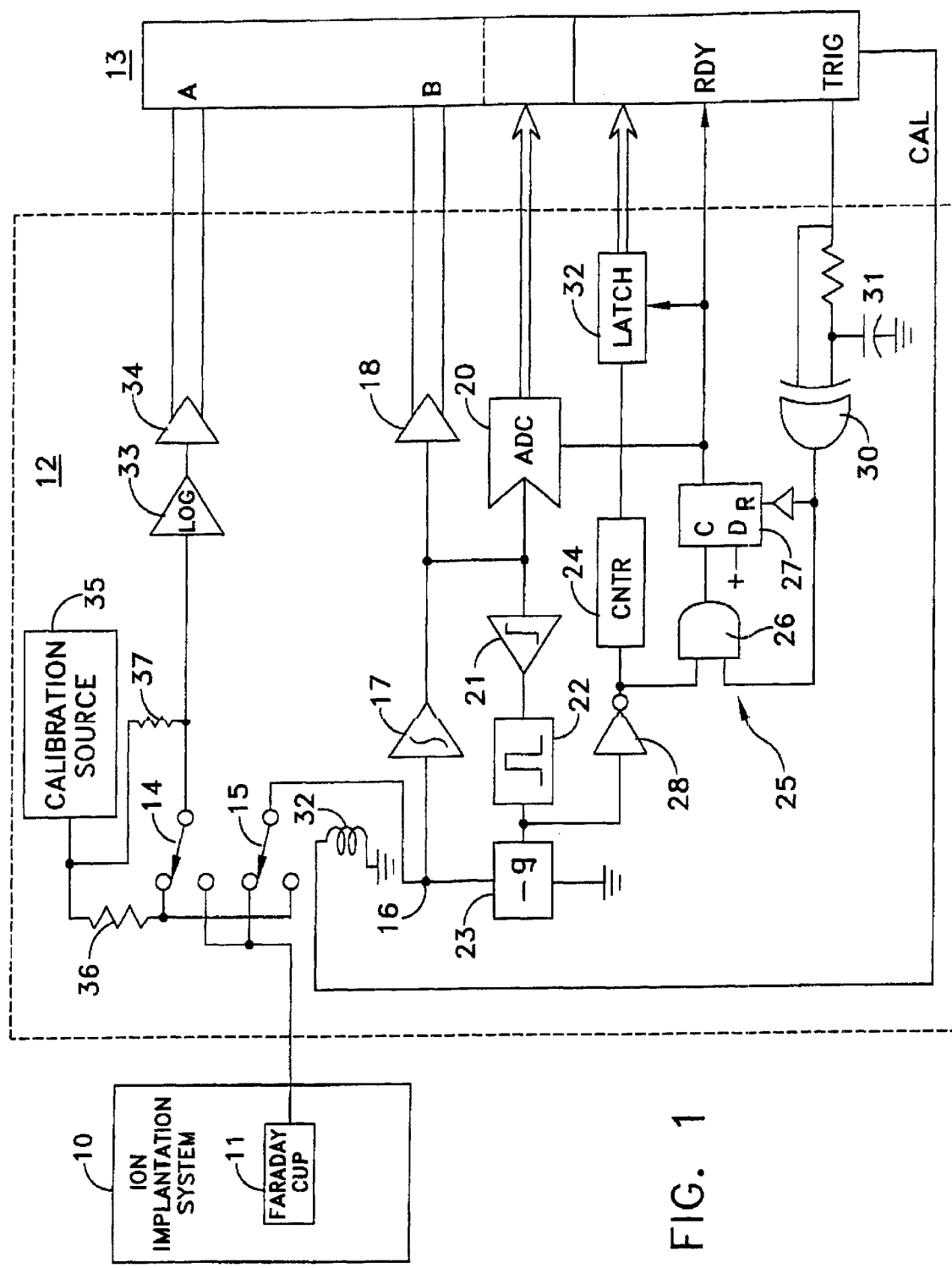
FIG. 1 is a block diagram depicting a dosimeter constructed in accordance with this invention.

FIG. 1 depicts schematically an ion implantation system 10 with a Faraday cup 11 and a dosimeter 12 operated in response to a controller 13 with a display, not shown. The controller 13 can comprise a computer or microprocessor control system.

Input switches 14 and 15 act in concert to establish either an operating mode, as shown in FIG. 1, or a calibration/beam profiling mode. In the operating mode a summing junction 16 at an input to a charge accumulator amplifier 17 receives a signal from the Faraday cup 11. The charge accumulator 17 may comprise a low leakage operational amplifier with capacitive feedback so its output is a function of accumulated charge over the measuring interval. An optional differential amplifier 18 provides a buffered signal for a display in the controller 13 or for ancillary equipment attached to the controller 13.

An analog-to-digital converter (ADC) 20 and a threshold circuit 21 also receive the output signal from the charge accumulator 17. Each of the operational amplifier 18 and the ADC 20 has high input impedance to minimize any loading of the output signal from the charge accumulator 17. In a particular embodiment of this invention, the ADC 20 has a 16-bit output and is scaled so that each output interval from the ADC 20 represents a charge of somewhat less than 3 pC.

As the output signal from the charge accumulator 17 rises, the signal applied to the input of the ADC 20 increases, as does the input to the threshold circuit 21. When this signal exceeds an established threshold, a multivibrator 22 generates a pulse train comprising at least one pulse. Each pulse causes a quantum pulser 23, acting as a charge removal circuit, to remove a fixed charge from the charge accumulator 17. In a particular embodiment of this invention the quantum pulser 23 reduces the accumulated charge by approximately 100 nanoCoulomb (nC). Each time that the quantum pulser 23 removes this fixed charge, the input signal to the ADC 20 decreases by a corresponding amount except for whatever input signal charge may have accumulated during the discharge time. This latter aspect is critical at higher currents, where the measurement charge accumulated during a discharge interval may be appreciable. The output from the multivibrator 22 also increments a counter 24 that registers the number of times the quantum pulser 23 produces its fixed quantum discharge.

Normally this one operation of the quantum pulser 23 removes a fixed charge that lowers the accumulator output signal below the threshold value so the multivibrator 22 causes the quantum pulser 23 to produce only one discharge. Should an overload occur such that the discharge is insufficient to drop the accumulator output below the threshold, the multivibrator 22 produces continuous pulses until the output from the charge accumulator 17 falls below the threshold. The counter 24 records each operation of the quantum pulser 23 in such a situation.

Consequently at any given time, the total accumulated charge equals the sum of two terms. The first term is the value in the counter 24 times the predetermined charge; this term represents the total charge removed by the quantum pulser 23 from the charge accumulator 17. The second term is the value from the ADC 20. For example, assuming each count from the ADC 20 corresponds to a charge of 3 pC, each operation of the quantum pulser 23 decreases the charge in the charge accumulator 17 by 100 nC. Assuming that a sample obtains a value of "25" from the counter 24 and a value of "30,000" from the ADC 20, the accumulated charge is 2590 nC. In one mode of operation the dosimeter 12 is normally operated by taking a charge reading at some appropriate starting time, and subtracting that initial charge reading from a second reading to determine the charge accumulated over that interval. Thus eliminating any need to reset the dosimeter 12. In some embodiments, this can be done as seldom as desired or as often as 200 kHz.

The controller 13 samples the outputs of the. ADC 20 and the counter 24 at convenient sampling times. In one particular embodiment, the sampling frequency is 200 kHz to provide a 5 $\mu$sec sampling interval. In other applications a sampling frequency may be different in order to accommodate other processes. More specifically, the controller 13 generates a TRIGGER pulse and records the time that pulse was produced. This pulse is asynchronous with respect to the operation of the multivibrator 22, so it may overlap or occur independently of the pulses from the multivibrator 22. If the TRIGGER pulse occurs between pulses from the multivibrator 22, an inverter 28 enables an AND gate 26 so the pulse, processed through an XOR gate 30, sets a flip-flop 27. This initiates a charge measurement by ADC 22 and reads the value in counter 24 into a latch 32. A return signal to an RDY input indicates to the controller that the data at the outputs of the ADC 20 and latch 32 are ready to be read. Thereupon the controller 13 can read the result and combine it with the time assigned to the corresponding TRIGGER pulse.

If the TRIGGER pulse overlaps with or is close to overlapping the pulse from the multivibrator 22 in time, a race condition between the TRIGGER pulse and the multivibrator pulse may make the outputs of the ADC 20 and the counter 24 unreliable. The dosimeter 12 in FIG. 1 therefore includes circuitry for producing a delay in that case to assure reliable readings. Specifically, if the multivibrator 22 is active, the inverter 28 disables the AND gate 26 so the TRIGGER pulse from the XOR gate 30 cannot produce an output from the flip-flop 27. However, when the pulse from the multivibrator 22 is finished, the AND gate 26 is re-enabled, allowing the pulse from the XOR gate 30 to generate a delayed measurement pulse to the flip-flop 27. A time delay circuit 31 establishes a delay that produces a pulse of appropriate length from any change in state of the TRIGGER signal, minimizing the number of controller operations. When the latch 27 then produces a RDY signal, other circuitry (not shown but known to those in the art) indicates that the data represents a delayed measurement. The programmable controller 13 then properly establishes a correspondence between the readings, the time of the TRIGGER pulse and the delay in the measurement.

Calibration of the dosimeter 12 in FIG. 1 is an easy task. Precise calibration currents are established by applying a precision calibration voltage source 35 to precision resistors 36 and 37. During the normal operating mode, current from calibration resistor 36 and 37 passes through switch 14 to the logarithmic current amplifier 33, which is not then connected to the Faraday cup. To calibrate the dosimeter 12, the controller 13 asserts a CAL signal that energizes a relay 32 for controlling the position of the switches 14 and 15.

Figure 2:
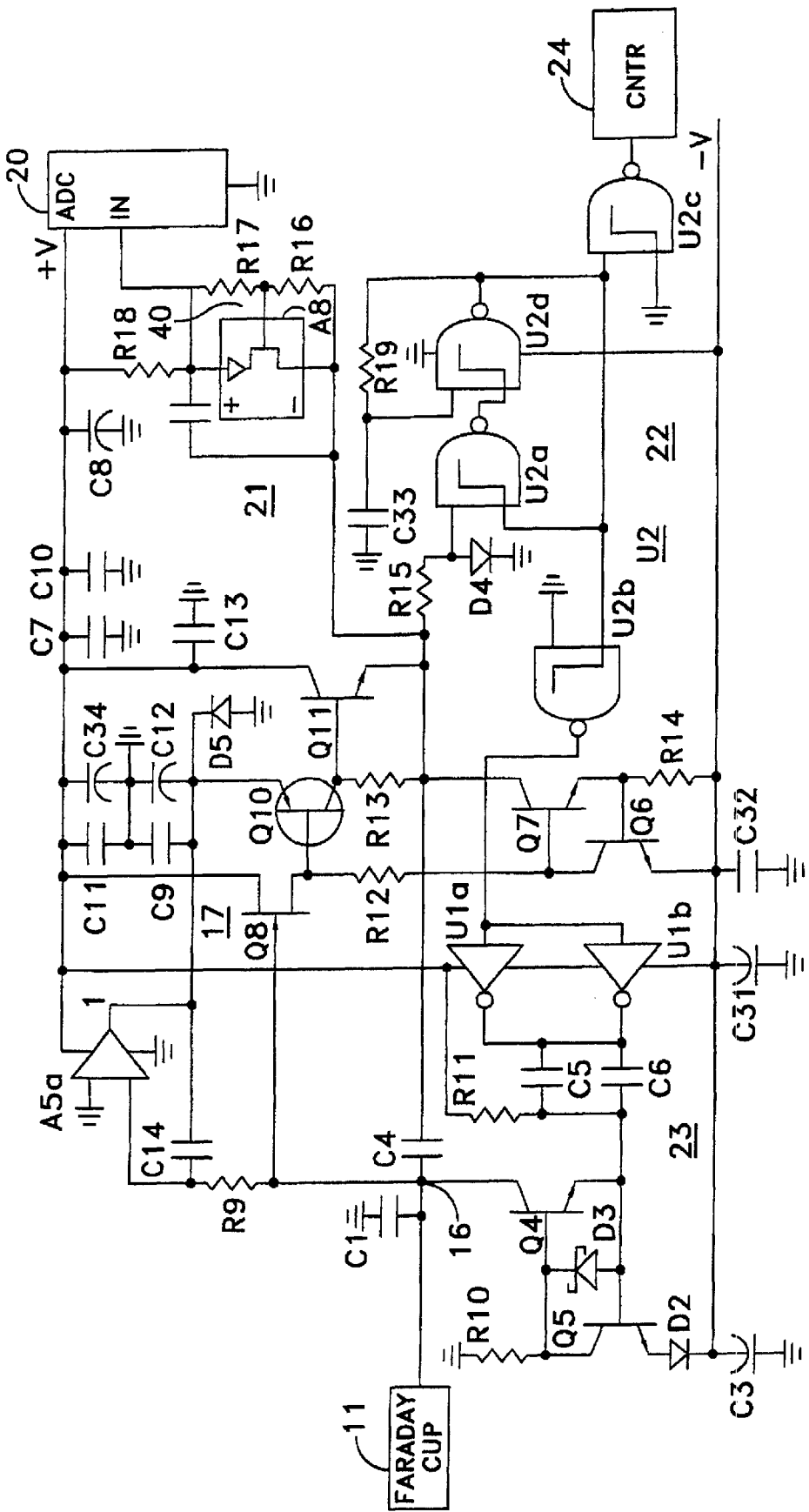
FIG. 2 is a detailed circuit diagram of the dosimeter shown in FIG. 1.

Energizing the relay 32 moves the contacts from their normal positions as shown in FIG. 2 to the opposite positions and establishes a calibration and beam profiling mode. In this mode, the output from the Faraday cup 11 is coupled into a low impedance log amplifier 33 and differential amplifier 34 to be displayed on a monitor, such as an oscilloscope. For calibration purposes, the switch 15 couples the calibration current from resistor 36 to the input of the charge accumulator 17. The calibration current is a known constant. In one embodiment the calibration current is 25 uA. This current establishes constant time intervals between successive discharges of the quantum pulser 23 that remove equal charges from the accumulator 17 at each discharge. The time period between discharges multiplied by the known calibration current yields the precise charge in each discharge. The sensitivity of the ADC 20 is then easily computed from the rate of rise of its output indications between discharges.

In normal operation the controller 13 may build a table, list or equivalent data structure over time. This table includes a series of time related entries. The time relationship for each entry may be explicit or implicit. For example, each entry may have a corresponding time stamp to define an explicit relationship. In the event of continuous sampling at a constant rate, a simple list of non-time-stamped entries whose times are each indicated by sequence provides the relationship implicitly. Each entry includes the measured value from the ADC 20 and the count from the counter 24 at that time or at the delayed time interval. As will be apparent, the resolution of the total reading will depend upon the number of output bits from the ADC 20. The maximum sampling frequency is dependent upon the time for the ADC 20 to convert an input signal into stable output signals and the signals from latch 32 to settle so they are valid. For example, a specific embodiment of the disclosed dosimeter 12 constructed in accordance with this invention has a maximum sampling frequency of 200 kHz. The quantum pulser decreases the accumulated charge by 100 nC with a resolution better than ±1% or ±3 pC, whichever is greater, over an operating range of ion beam currents from 0.1 $\mu$A to 30 mA.

For scanned beam current profiling purposes, the CAL signal causes the switch 14 to divert the output from the Faraday cup 11 into the fast log current amplifier 33 for use in beam current profiling with a monitor, such as an oscilloscope, with an analog data acquisition port of the controller 13 or other data acquisition system. During normal operation, with CAL disabled, the calibration source 35, through calibration resistors R36 and R37, provides calibration current to the log amplifier. Then, in CAL (and profiling) mode, resistor R37 alone provides a smaller calibration current to calibrate the span of the log amplifier when the source of input current is turned off. If each TRIGGER pulse is synchronized to each beam scan, the TRIGGER pulses can be used as synchronizing signals for an oscilloscope or other display to the scan of the ion beam. This tool enables the measurement of beam profiles by either time or comparative amplitudes when the controller 13 is unable to sample the charge dosimeter with a sufficiently high sampling frequency to provide a timely current profile, or where the differentiation process for determining beam current takes too much time.

As will therefore be apparent, the dosimeter in FIG. 1 attains several objectives of this invention. It has a wide dynamic range of input current. In this specific embodiment about 300,000:1. Its dynamic charge measurement range has no practical limit, and the accuracy and resolution are maintained over the entire dynamic range. The dosimeter is easy to calibrate. It has an operating speed up to 200 kHz at any input current.

As will now become more apparent this dosimeter is also practical to manufacture. More specifically, the heart of this invention lies in the interaction between the charge accumulator 17, the ADC 20, the threshold circuit 21, the multivibrator circuit 22, the quantum pulser 23 and the counter 24. FIG. 2 depicts a practical implementation of these major components with the input from the Faraday cup 11 applied to the summing junction 16. The charge accumulator 17 includes a series of electronic components that constitute a very low leakage, low offset voltage, fast acting amplifier with a stable feedback capacitor C4. In the specific embodiment shown in FIG. 2, the charge accumulator 17 utilizes a low-leakage, high-speed JFET Q8 connected as a common-drain source follower that connects to the base of a very high frequency, low-noise PNP inverting transistor Q10 that, in turn, drives the base of a high-frequency noninverting signal follower Q11. Consequently a positive-going input signal at the gate of Q8 JFET results in a negative-going signal at the emitter of the signal follower Q11 that provides stable negative feedback. A precision CMOS operational amplifier A5a connects to the input junction 16 to adjust any DC offset in the fast acting amplifier to very low levels.

The feedback capacitor C4 connects between the input 16 and the emitter of the signal follower Q11. Essentially all input current has to flow through the C4 capacitor because the input current to the gate of the JFET Q8, the leakage current from the quiescent discharge circuit at Q4, and the bias current to the CMOS operational amplifier A5a are all very small. The input offset voltage at 16 remains small and nearly constant due to the high loop gain of the charge accumulator 17. The voltage on the C4 capacitor is thus proportional substantially only to accumulated charge from the input current, which is the accumulated charge from the Faraday, cup 11.

The collector current for the signal follower Q11 must accommodate the maximum amplifier current. In one specific embodiment where the maximum rated amplifier current is 30 mA, the Q11 signal follower is selected to accommodate a 70 mA collector current. In addition the emitter of the signal follower Q11 is also coupled to the input of the ADC converter 20 through a constant-voltage level-shifter 40. The level shifter 40 includes a programmable voltage reference A8 programmed by selection of R16 and R17 resistors and a current-bias resistor R18. The level shifter 40 shifts the mid-range of the voltage at the emitter of the Q11 signal follower to the mid-range of the specified input voltage range for the ADC 20.

The exact value of the threshold voltage for the threshold circuit 21 is not critical. As previously indicated, each time the threshold is reached, the quantum pulser 23 removes a precise incremental charge. There is a requirement, however, that this incremental charge be less than the overall range of the ADC 20 so that some measurable charge remains in the charge accumulator 17 after a charge is removed. In one specific embodiment the trigger level is a lower threshold voltage in a Schmidt trigger NAND logic inverter that establishes a trigger at about −3 volts when the inverter is supplied with a −5 volt power supply. Thus when the emitter of signal follower Q11 reaches approximately −3 volts, it turns on the multivibrator 22.

The multivibrator 22 is formed as a gated oscillator that utilizes a conventional integrated feedback Schmitt inverter relaxation oscillator U2d that drives its own input between its two Schmitt thresholds through an integration network comprising the capacitor C33 and resistor R19. This oscillator continues to run so long as it is enabled. More specifically, when the negative-going voltage at the emitter of the Q11 signal follower reaches below the threshold established by NAND gate U2a, its output goes high. This enables NAND gate U2d to operate in an oscillating mode. That is, once the oscillator 22 is gated on, it runs as long as the input from the charge accumulator 17 amplifier is below its input threshold. Normally, as previously described, only the first oscillation will occur because the resulting fixed charge that is removed from the charge accumulator 17 shifts its negative output voltage back above the threshold value to toggle the NAND gate U2a and thereby to turn off the oscillator. However, as previously stated, should a large transient input current occur such that a single operation of the quantum pulser does not reduce the output from the charge accumulator 17 to a value sufficiently below the threshold value, the oscillator continues to run, removing successive fixed charges and incrementing the counter 24 until the output voltage from the charge accumulator 17 falls below the threshold.

The quantum pulser 23 comprises two parallel capacitors C5 and C6 and two parallel inverting drivers designated U1a and U1b. When the negative-going output from the charge accumulator 17 is less than the negative threshold value, the inverting drivers U1a and U1b have a high output, thereby essentially attaching one side of each of the capacitors C5 and C6 to a high reference voltage. A Q4 NPN transistor is normally biased off in this condition by a Q5 NPN transistor normally saturated by current from the resistor R11, blocking any conduction through the Q4 transistor. In this mode, a D3 Schottky diode clamp D3 assures that the Q5 NPN transistor never fully saturates, so that it can operate at high speed.

When the negative threshold at U2a is exceeded, the outputs from the inverting amplifier U1a and U1b shift to the negative supply voltage, e.g., −5 volts. The resulting discharge current through C5 and C6 turns off the Q5 NPN transistor so the Q4 NPN transistor turns on, conducting nearly all of the (negative) discharge current to the input of accumulator 17 at input node 16. During the fast transition of the U1a and U1b drivers from +V to −V, the total amount of charge carried by the discharge current is the product of the transition voltage difference and the combined capacitance of C5 and C6. With +V and −V voltages, the voltage change across the C5 and C6 capacitors is 2*V, or approximately 10 volts, assuming that the +V and −V voltages are +5 and −5 volts respectively. When the very fast U1a/U1b transition is complete, and the very fast, very large discharge current through C5 and C6 has decayed, current through R11 turns the Q5 NPN transistor on again, and the voltage at the emitter of the Q4 transistor returns to exactly the voltage it started at, while the other ends of capacitors, C5 and C6 changed by exactly 10 volts.

The charge on a capacitor is its voltage times its capacitance (Q=CV), so the total charge that flows out of the C5 and C6 capacitors through the Q4 NPN transistor to the charge accumulator 17 is a predetermined amount. In one particular example where C5=C6=0.005 $\mu$Fd, the resulting total capacitance of 0.01 $\mu$Fd stores a fixed charge of 100 nC. As this process can occur within 100 nanoseconds, any error due to current in the R11 resistor is about 19 pC, or approximately 0.02% of 100 nC. Variations in the current lost to the base circuit of the Q4 NPN transistor are also negligible.

When the charge removal, or discharge, cycle is finished, the negative pulse at the outputs of U1a and U1b drivers is toggled back to +V. A positive charging pulse of similar high current and 100 nC charge then passes through the C5 and C6 capacitors to the negative power supply (−V) through the base-emitter junction of the Q5 NPN transistor and the diode D2. The Q5 NPN transistor still blocks the Q4 NPN transistor from conducting. When that transient is complete, the C5 and C6 capacitors are charged and ready for the next discharge cycle. In one embodiment, the discharge/charge cycle typically takes 1.5 uS.

In use, a dosimeter typically is calibrated before a measurement begins. The controller 13 asserts the CAL signal to activate the relay 32 so the input 16 receives the calibration current from the calibration current resistor R36. The calibration source 35 is a precision voltage source, which in one embodiment is 2.5 volts. The calibration current resistor R36 is selected to produce any convenient value in the operating range, as, for example, 100 kilohms to produce 25 $\mu$a. The controller 13 measures the exact time between operations of the quantum pulser 23. Determination of the charge value associated with each operation of the quantum pulser 23 is then made. For example, assume the constant current is 25 uA, corresponding to an accumulation of 100 nC each 4 milliseconds. The frequency of operation of the quantum pulser should be 250 Hz if the discharge pulse is exactly 100 nC. If the calibration frequency is 245, then the actual charge removed during each operation of the quantum pulser 23 is 102.04 nC. When the controller 13 calculates the accumulated removed charge, it uses that calibrated charge value. At the same time, this calibration charge, divided by the number of ADC units spanned between discharges, determines the calibration of the ADC 20, that is, the precise value for the correspondence between each value from the ADC 20 and the charge being measured. Other calibration strategies, such as (1) least-square fits to successive linear ramps and (2) vertical and horizontal intercepts for ADC and discharge calibrations to avoid tiny errors due to discharge times, could be used in lieu of or as a complement to the calibration procedure described above.

Once the calibration is complete, the controller 13 disables the CAL signal, so the switches 14 and 15 shift to the positions shown in FIG. 2. The controller 13 then issues TRIGGER pulses at intervals of its choice up to 200 kHz. With each TRIGGER pulse the controller stores a time reference in a table unless, as stated above, a constant frequency is used, and time is implicit in the data sequence. When the RDY signal is received, the controller 13 reads the value from the ADC 20 and the latch 32 to store the values with the corresponding time reference. Other systems in the controller 13 use the accumulated charge to provide an essentially real-time accumulated charge value for control or monitoring purposes.

From the foregoing, it will be noted that the process of charge removal from the accumulator at the pulse threshold does not interfere with the continued accumulation of input current during the discharge, in accordance with this invention. Consequently, the integrity of the charge accumulation is maintained over long periods, many discharges, and a wide dynamic range. Moreover, the resulting data accumulated over a measurement interval can be used to determine the pattern for the charge accumulations and can be easily differentiated with respect to time to provide beam current as a function of time. As all the circuitry at the summing junction 16 shown in FIGS. 1 and 2 is low leakage circuitry, the operation of the quantum pulser 23 does not interrupt or alter the measurement of the signal from the Faraday cup 11.

As previously indicated, a dosimeter constructed as shown in FIG. 1 has exhibited the ability to provide a 200 kHz sampling rate, to measure currents in the range from 0.1 $\mu$A to 20 mA, a dynamic range of 300,000:1. Over the range, the accuracy of the readings is maintained. Thus, FIGS. 1 and 2 depict a specific embodiment of this invention that attains all of the objectives of this invention by providing a dosimetry function characterized by accuracy, a wide dynamic range and a high sampling rate.

Figure 3:
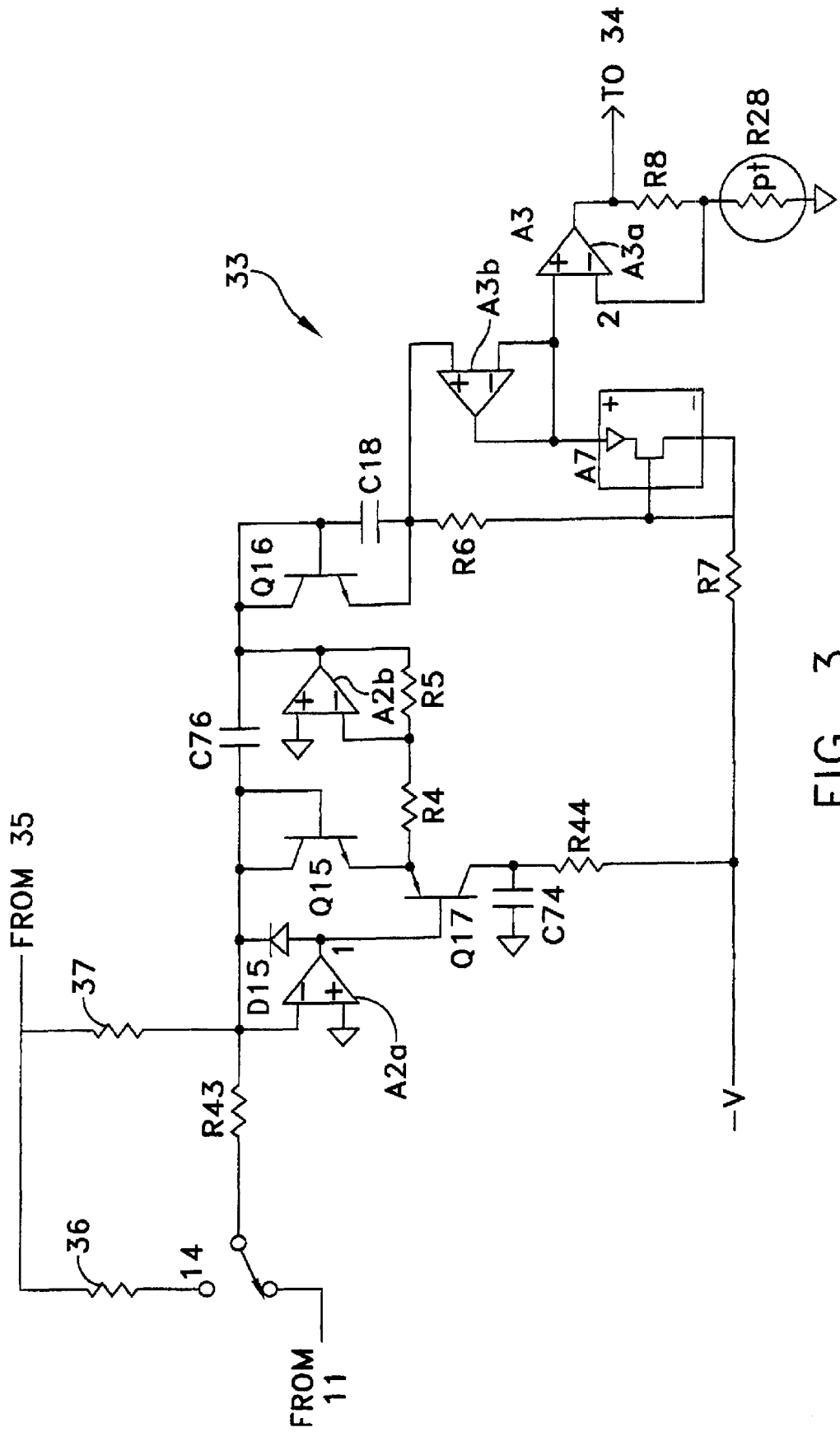
FIG. 3 is a detailed circuit diagram of a log amplifier useful in the dosimeter shown in FIG. 1.

FIG. 3 is a detailed schematic of one embodiment of the fast acting logarithmic amplifier 33 shown in FIG. 1 that is adapted for performing beam profiling as an adjunct to the accumulated charge measurement of the circuit of FIG. 1. The amplifier 33 of FIG. 3 allows the measurement of fast time signatures or nearly equal peak values. This circuit overcomes limits on the speed of the time response of a logarithmic measurement circuit that normally is limited by the capacitance across a log diode element and its incremental impedance. In the beam profiling mode (CAL mode), the beam current from the Faraday cup 11 is applied to one section of a high speed JFET operational amplifier A2a characterized by having very low leakage and low voltage offset. A Q15 NPN transistor is connected to closely follow the Shockley diode equation:

$$i = Io\left(\mathrm{EXP}\left(\frac{qV}{kT}\right) - 1\right) \quad (1)$$

where V is the applied voltage, q is the electronic charge, k is Boltzmann's constant, T is the absolute temperature and Io is a diode leakage term that varies with temperature. Equation (1) can be rewritten as:

$$V = \frac{kT}{q}\ln\left(1 + \frac{i}{Io}\right) \quad (2)$$

As will be apparent from FIG. 3 the Q15 NPN transistor lies in the negative feedback loop for the A2a operational amplifier. Consequently the output voltage is determined by the input current flowing through this element and is:

$$V_{2d} = \left(\frac{kT}{q}\right)\ln\left(1 + \frac{input}{Io}\right) \quad (3)$$

A Q16 NPN transistor connects to the output of an A2b operational amplifier that inverts the logged signal to a positive value and applies the positive value back to the input through the capacitor C76. This partially cancels the passive capacitive component of the NPN log element Q15 to increase its response.

The Q16 NPN transistor couples the inverted, negative Q15 signal from the output of the amplifier A2b through voltage follower amplifier section A3b and to an amplifier section A3a. A predetermined constant current from a bias current resistor R6 flows through the Q16 NPN transistor from a precision reference supply A7 to generate a compensating voltage, according to Equation (1), determined by the current through the R6 resistor.

As the positive terminal of the Q16 transistor is placed at the output of the A2b amplifier, its voltage subtracts from the voltage across the Q15 NPN transistor such that the result applied via follower A3b to the positive input of the A3a amplifier is:

$$V_{\log 3a} = V_{Q15} - V_{Q16} \qquad (4)$$

$$= \frac{kT}{q}\left(1 + \frac{input}{Io}\right) - \frac{kT}{q}\ln\left(1 + \frac{bias}{Io}\right)$$

$$= \frac{kT}{q}\ln\left[\frac{\left(1 + \frac{input}{Io}\right)}{\left(1 + \frac{bias}{Io}\right)}\right]$$

$$= \frac{kT}{q}\ln\left[\frac{(Io + input/Io)}{Io + bias/Io}\right]$$

$$= \frac{kT}{q}\ln\left[\frac{Io + input}{Io + bias}\right]$$

As the term Io in Equation (4) is significantly smaller by many orders of magnitude than the normal operating current, it can be ignored, so Equation (4) becomes:

$$V_{\log 3a} = \frac{kT}{q}\ln\left(\frac{input}{bias}\right) \qquad (5)$$

This analysis indicates that for similar transistors the voltage applied to the operational amplifier A3a is proportional to the log of the input current divided by a constant bias current that can be chosen. It is also proportional to the absolute temperature. The constants Q and K never change, and the temperature dependent Io terms cancel.

Differentiating Equation (1) shows that the incremental resistance—the slope of the transistor's V/I curve, is:

$$r = \frac{dv}{di} = \frac{kT}{qi} \qquad (6)$$

If, for example, the bias current through the resistor R6 is 100 nA, r=260 kilohms, yielding a time constant, with the roughly 8 pfd capacitance of the Q15 NPN transistor of about 2 usec. A 2 usec time constant yields a sufficiently high speed for profiling. However, speed is dependent upon current; more speed for more current. Adding a permanent calibration current of 25 nA via R37 to the log amp input assures that the amplifier operates in a normally speeding operating range at all time.

The amplifier A3a includes a feedback divider comprising resistors R8 and R28. The platinum resistor R28 has a platinum element whose resistance is roughly proportional to absolute temperature and therefore causes the amplifier A3a to have a gain that is inversely proportional to temperature, thereby to provide a gain correction for temperature.

As input current increases, the $V_{log3a}$ voltage applied to the input of the operational amplifier A3a becomes more positive. The gain of amplifier A3a is selected to produce a change of 1 volt per decade of input current change. The bias resistor R6 and the voltage reference A7 are chosen to provide an output signal range that fits within the output range of the operational amplifier A3a using a ±V supply. To cover six decades, the base resistor R6 and voltage reference A7 provide an output signal range of about 6 volts. Assuming the power supply is ±5 volts, the output variations lie within the circuit's operating capabilities.

The resulting output signal from the operational amplifier A3a is coupled to the differential amplifier 34 shown in FIG. 1 that is a voltage follower inverter amplifier pair to provide a differential readout for any type of monitoring device.

Only specific portions of the circuit have been shown in detail. FIG. 4 is a table of components and values that will aid in an understanding of the construction of one embodiment of this invention. Implementation of other portions, such as the calibration source 35 or circuitry associated with the XOR gate 30 for generating a trigger signal are all within the capabilities of persons of ordinary skill in the art given the functional description of each portion and adaptations to the needs of individual implanters and operational scenarios. For example, some applications may require optical isolation. In still others, using a constant sampling frequency may require a real time index input to synchronize the data to other events. In the latter embodiment, charge removal pulses as well as this real time index are indicated in the data stream and are processed for evaluation in the host controller.

Figure 5:
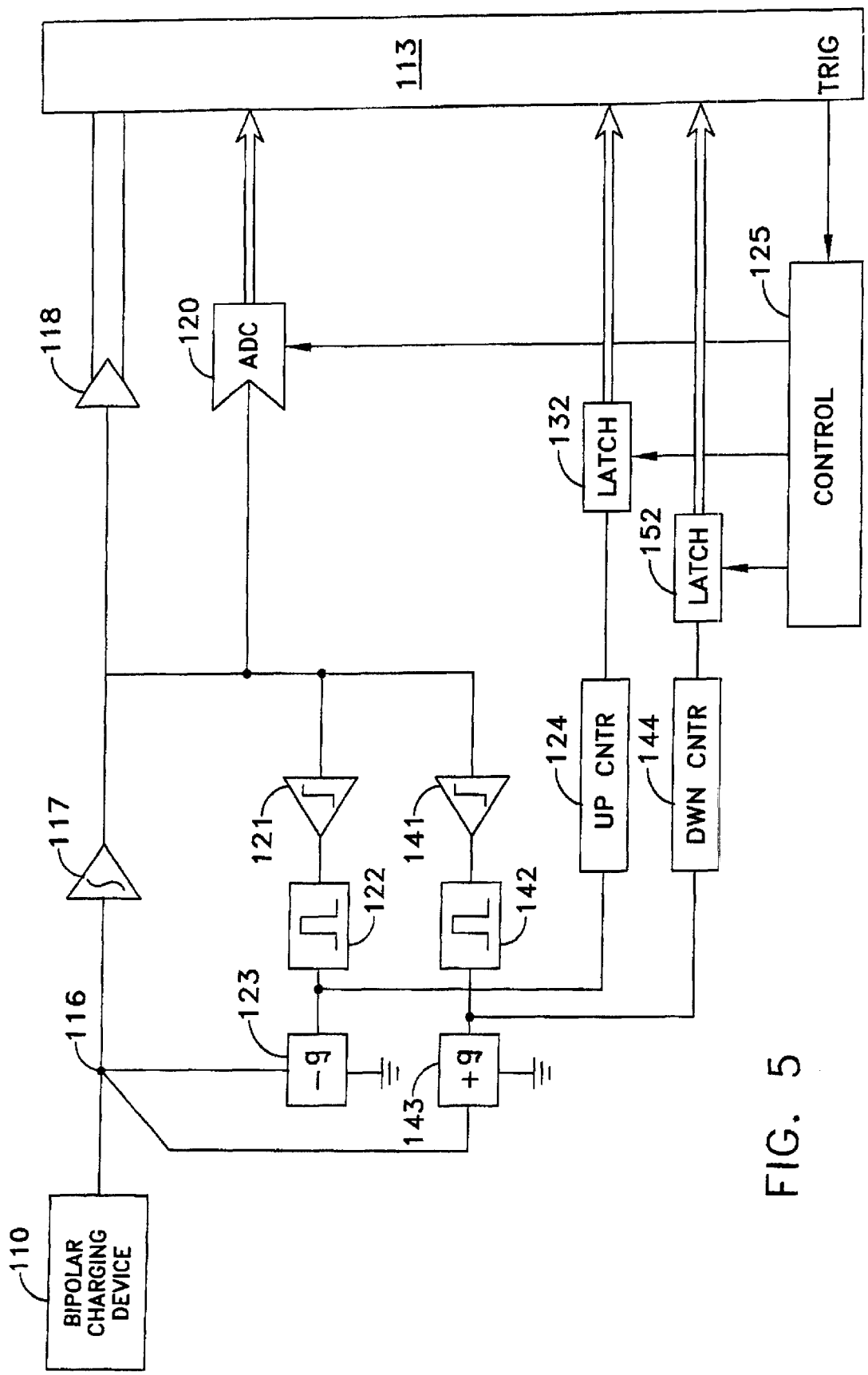
FIG. 5 is a block diagram depicting portions of a bipolar charge measuring device constructed in accordance with this invention.

FIGS. 1 through 4 depict a dosimeter that is particularly useful in connection with circuits in which charge is only increasing. In addition, this invention is readily adapted to applications in which measurements of charge depletion or both charge increase and depletion would be advantageous. That is, measurements where the device being monitored dissipates charge or operates in a bipolar manner with both the accumulation and dissipation of charge. FIG. 5 depicts, in block form, a modification of the circuit in FIG. 1 to make measurements in an application for bipolar measurements wherein a monitored device 110 produces a positive or negative signal that results in charge being either accumulated or drained. In this figure it is assumed that a positive sign indicates charge accumulation.

A basic understanding of this application requires only an understanding of the basic elements that are shown in FIG. 5. Other details are not shown, such as the details of the calibration process, the control circuit for responding to the TRIG signal and the logarithmic amplifier in FIG. 1. The incorporation of these details and functions are not shown in FIG. 5, but the means and method of incorporating these details and functions in the circuit of FIG. 5 will be readily understood by persons of ordinary skill in the art.

In FIG. 5 the bipolar charging device 110 produces an input at a summing junction 116 that is an input to a charge accumulator 117. Like the charge accumulator 17 in FIG. 1, the charge accumulator 117 in FIG. 5 comprises a low leakage operational amplifier with capacitive feedback. An operational amplifier 118 and the ADC 120, like the amplifier 18 and ADC 20 in FIG. 1, have high input impedance.

An analog-to-digital converter (ADC) 120, a first threshold circuit 121 and a second threshold circuit 141 also receive the output signal from the charge accumulator 117. The ADC 120 in FIG. 5 has similar operating characteristics to the ADC 20 in FIG. 1.

As the output signal from the charge accumulator 117 rises in response to a positive signal from the bipolar charging device 110, the signal applied to the inputs of the ADC 120 and threshold circuits 121 and 141 rises. When this signal exceeds an established first threshold, a multivibrator 122 generates a pulse train comprising at least one pulse. A quantum pulser 123, acting as a first charge modifying circuit, removes a fixed charge from the charge accumulator 117. Conversely, if the signal falls below a second threshold established by the threshold circuit 141, a multivibrator 142 generates a pulse train comprising at least one pulse. A quantum pulser 143, acting as a second charge modifying circuit, adds a fixed charge to the charge accumulator. As will be apparent, in this embodiment the second threshold will be less than the first threshold.

Each time one of the multivibrators 122 or 141 produces a pulse, a corresponding one of counters shown as an up counter 124 and a down counter 144 changes value. Each pulse from the multivibrator 122 increments the up counter 124; each pulse from the multivibrator 141 decrements the down counter 144.

Consequently at any given time, the total accumulated charge equals the algebraic sum of three terms. The first term is the value in the counter 124 times the predetermined charge that characterizes the quantum pulser 123. The second is the value in the counter forces the predetermined charge that characterizes the quantum pulser 143. The third term is the value from the ADC 120.

Like the circuit in FIG. 1, the controller 113 samples the outputs of the ADC 120 and the counters 124 and 144 at convenient sampling times and produces an algebraic sum. A control circuit 125, analogous to the control circuit 25 in FIG. 1, responds to a TRIG signal to provide a sample to the controller 13. The use of dual counters 124 and 144 produce accurate results in a wide variety of applications. In some applications it may be possible to substitute an up-down counter for the individual counters 124 and 144.

Thus, FIG. 5 depicts a charge measuring device 100 that is useful with bipolar charging devices. It will also be apparent from FIG. 5 that the dosimeter in FIG. 1 and the charge measuring device in FIG. 5 are readily adapted for applications that measure charge where an initial charge depletes over time. In whatever form, the various details of construction as shown in FIGS. 2 and 4 can be incorporated in the modified circuits, such as the dosimeter of FIG. 5.

This invention has been disclosed in terms of certain embodiments and applications. It will be apparent that many modifications can be made to the disclosed apparatus, and many current and charge measuring applications served other than measuring only ion beam currents, without departing from the invention. Therefore, it is the intent of the appended claims to cover all such applications, variations and modifications as come within the true spirit and scope of this invention.

What is claimed as new and desired to be secured by letters patent of the united states is:

1. A dosimeter for measuring charge accumulated in a charge gathering means comprising:
    A) a charge accumulator having an input connected to the charge gathering means and an output for producing a signal representative of accumulated charge,
    B) charge measuring means for measuring the magnitude of the accumulated charge at said charge accumulator output,
    C) charge altering means at said charge accumulator input for producing a fixed change in the charge of said charge accumulator during a single operation when the charge in said charge accumulator reaches a predetermined threshold, and
    D) counting means for counting the number of operations of said charge altering means whereby the count and indicated charge magnitude yield the total accumulated charge.

2. A dosimeter as recited in claim 1 wherein said charge altering means includes:
    i) a switched capacitive storage circuit for storing a fixed charge and having charging and discharging modes of operation,
    ii) a threshold circuit for shifting said switched capacitive storage circuit between the charging and discharging modes of operation whereby during its discharge mode, said switched capacitive storage circuit superimposes the said fixed change in the charge of said charge accumulator when the signal at said charge accumulator output reaches the predetermined threshold value.

3. A dosimeter as recited in claim 2 wherein said charge measuring means measures a predetermined range of charges, said switched capacitive storage circuit operating in the charging mode to store the fixed charge with a value that is less than said predetermined range of charges, and wherein the predetermined threshold value is also within said predetermined range of charges.

4. A dosimeter as recited in claim 2 wherein said charge accumulator includes:
    i) a low leakage current amplifier with an input and output,
    ii) a feed back capacitor for said amplifier for storing charge, and
    iii) a summing junction at said amplifier input for connection to the charge gathering device and to said charge altering means.

5. A dosimeter as recited in claim 4 wherein each of the other components in said charge accumulator including said feedback capacitor are constituted by low leakage components.

6. A dosimeter as recited in claim 2 wherein said charge measuring means includes an analog-to-digital converter connected to said charge accumulator output for generating a digital output and said counting means includes means for generating a digital output whereby said dosimeter presents the accumulated charge as values in digital form.

7. A dosimeter as recited in claim 6 additionally comprising means for sampling the accumulated charge connected to said outputs of said analog-to-digital converter and to said counting means.

8. A dosimeter as recited in claim 2 wherein said counting means comprises a counter with an input for enabling a signal to change the contents of the counter, said counter input being responsive to each operation of said charge altering means.

9. A dosimeter as recited in claim 8 additionally comprising means for sampling the accumulated charge value connected to said outputs of said charge accumulator, said counting means additionally including a latch for receiving the contents of said counter each time said sampling means samples the accumulated charge value.

10. A dosimeter for measuring charge accumulated in a charge gathering means comprising:
    A) a charge accumulator having an input connected to the charge gathering means and an output for producing a signal representative of accumulated charge, said charge accumulator including:
        i) an amplifier with an input and output,
        ii) a feed back capacitor for said amplifier for storing charge, and
        iii) a summing junction at said amplifier input for connection to the charge gathering device and to said charge removing means
    B) charge measuring means for measuring the magnitude of the accumulated charge at said charge accumulator output,
    C) charge removal means at said charge accumulator input for removing a fixed charge from said charge accumulator during a single operation when said charge magnitude reaches a predetermined threshold, said charge removal means including:
        i) a switched capacitive storage circuit for storing a fixed charge having charging and discharging modes of operation, and
        ii) a threshold circuit for shifting said switched capacitive storage circuit between the charging and discharging modes of operation whereby said switched capacitive storage circuit discharges the fixed charge from the input of said charge accumulator when the signal at said charge accumulator output exceeds the predetermined threshold value, and D) counting means for counting the number of operations of said fixed incremental charge means whereby the count and indicated charge magnitude correspond to the accumulated charge.

11. A dosimeter as recited in claim 10 wherein each of said charge accumulator, charge measuring and charge removal means comprises low leakage components.

12. A dosimeter as recited in claim 10 wherein said charge measuring means includes an analog-to-digital converter connected to said charge accumulator output for generating a digital output and said counting means including means for generating a digital output whereby said dosimeter presents the accumulated charge as charge values in digital form.

13. A dosimeter as recited in claim 12 additionally comprising means for sampling the accumulated charge connected to said outputs of said analog-to-digital converter and to said counting means.

14. A dosimeter as recited in claim 12 wherein said counting means comprises a counter with an input for enabling a signal to change the contents of the counter, said counter input being responsive to each operation of said charge removal means.

15. A dosimeter as recited in claim 14 additionally comprising means for sampling the accumulated charge value connected to said outputs of said charge accumulator, said counting means additionally including a latch for receiving the contents of said counter each time said sampling means samples the accumulated charge value.

16. A dosimeter for measuring charge accumulated in a Faraday cup in ion implantation device comprising:
A) a charge accumulator amplifier with an input and output having a feed back capacitor for storing charge and a summing junction at said amplifier input for connection to the Faraday cage,
B) a charge measuring analog-to-digital converter connected to said charge accumulator amplifier output for generating a digital output,
C) a switched capacitive storage circuit for storing a fixed charge connected to said charge accumulator amplifier input having charging and discharging modes of operation,
D) a threshold circuit for shifting said switched capacitive storage circuit between the charging and discharging modes whereby said switched capacitive storage circuit discharges the fixed charge from the input of said charge accumulator amplifier when the signal at said charge accumulator amplifier output exceeds a predetermined threshold value, and
E) a counter connected to said switched capacitive storage unit that changes its count each time said switched capacitive storage circuit discharges whereby the outputs from said charge measuring analog-to-digital converter and said counter yield accumulated charge.

17. A dosimeter as recited in claim 16 wherein each of said charge accumulator amplifier, said charge measuring analog-to-digital converter, said incremental charge switched capacitive storage circuit and said threshold circuit comprises low leakage components.

18. A dosimeter as recited in claim 16 additionally comprising calibration circuit including:
i) means for generating a predetermined current, and
ii) a switch for shifting said charge accumulator amplifier input to receiving the predetermined current and for isolating the input from the signal generated by the Faraday cage.

19. A dosimeter as recited in claim 16 additionally comprising a computer-driven circuit for controlling said dosimeter thereby to sample the accumulated charge over time.

20. A dosimeter as recited in claim 16 additionally comprising a calibration current generator, an electrical load and switch to apply the output of said calibration current generator to said charge accumulator amplifier input and the output from the Faraday cup to the electrical load whereby the frequency of said switched capacitive storage circuit operation determines the magnitude of the fixed charge and the change in the value of the charge measuring analog-to-digital converter determines the magnitude of charge associated with each output therefrom.

21. A dosimeter as recited in claim 16 additionally comprising a calibration current generator, a fast acting logarithmic amplifier and switch to apply the output of said calibration current generator to said charge accumulator amplifier input and the output from the Faraday cup to said fast acting logarithmic amplifier whereby the output therefrom provides an input for displaying beam profiles.

22. A dosimeter for measuring the net charge accumulated in a charge gathering means comprising:
A) a charge accumulator having an input connected to the charge gathering means and an output for producing a signal representative of accumulated charge,
B) charge measuring means for measuring the magnitude of the accumulated charge at said charge accumulator output,
C) first charge modifying means at said charge accumulator input for removing a fixed charge from said charge accumulator during a single operation when the charge in said charge accumulator exceeds a first predetermined threshold, and
D) second charge modifying means at said charge accumulator input for adding the fixed charge from said charge accumulator during a single operation when the charge in said charge accumulator falls below a second predetermined threshold, and
E) counting means for counting the number of operations of said first and second charge modifying means whereby the net count and indicated charge magnitude yield the total charge accumulated in said charge gathering means.

23. A dosimeter as recited in claim 22 wherein each of said charge modifying means includes:
i) a switched capacitive storage circuit for storing a fixed charge and having charging and discharging modes of operation,
ii) a threshold circuit for shifting said switched capacitive storage circuit between the charging and discharging modes of operation whereby said switched capacitive storage circuit modifies the charge in said charge accumulator by a fixed charge when the signal at said charge accumulator output reaches the predetermined threshold value at said corresponding threshold circuit.

24. A dosimeter as recited in claim 23 wherein said charge accumulator includes:
iii) a low leakage current amplifier with an input and output,
iv) a feed back capacitor for said amplifier for storing charge, and
v) a summing junction at said amplifier input for connection to the charge gathering device and to each of said charge modifying means.

* * * * *